United States Patent
Nakagawa et al.

(10) Patent No.: US 8,942,567 B2
(45) Date of Patent: Jan. 27, 2015

(54) OPTICAL RECEIVING DEVICE AND COMMUNICATION SYSTEM

(75) Inventors: Goji Nakagawa, Kawasaki (JP); Susumu Kinoshita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 383 days.

(21) Appl. No.: 13/324,578

(22) Filed: Dec. 13, 2011

(65) Prior Publication Data

US 2012/0213528 A1 Aug. 23, 2012

(30) Foreign Application Priority Data

Feb. 23, 2011 (JP) ................ 2011-037688

(51) Int. Cl.
| H04B 10/06 | (2006.01) |
| H04B 10/12 | (2006.01) |
| H01S 3/10 | (2006.01) |
| H04B 10/67 | (2013.01) |
| H04B 10/291 | (2013.01) |
| G02B 6/42 | (2006.01) |
| H01S 5/022 | (2006.01) |
| H01S 5/40 | (2006.01) |

(52) U.S. Cl.
CPC .......... *H04B 10/673* (2013.01); *H04B 10/2914* (2013.01); *G02B 6/4206* (2013.01); *G02B 6/421* (2013.01); *H01S 5/02216* (2013.01); *H01S 5/4031* (2013.01)
USPC ........... 398/141; 398/140; 398/202; 398/131; 385/33; 385/140

(58) Field of Classification Search
CPC ...... H04B 10/12; H04B 10/152; H04B 10/60; H04B 10/66; H04B 10/73
USPC .......................... 398/140, 141, 202
See application file for complete search history.

(56) References Cited

U.S. PATENT DOCUMENTS

| 7,548,669 | B2 | 6/2009 | Nakagawa |
| 7,702,197 | B2 | 4/2010 | Nakagawa |
| 2004/0033004 | A1* | 2/2004 | Welch et al. ................ 385/14 |
| 2008/0226229 | A1 | 9/2008 | Nakagawa |
| 2010/0266293 | A1 | 10/2010 | Sone et al. |

FOREIGN PATENT DOCUMENTS

| GB | 2374221 | 10/2002 |
| JP | 2007-033853 | 2/2007 |
| JP | 2008-235376 | 10/2008 |
| JP | 2010-252044 | 11/2010 |

OTHER PUBLICATIONS

Cheng ["Large Splitting and Long Reach Passive Optical Networks with Mode Coupling receivers". ECOC 2010, Sep. 19-23, 2010, Torino, Italy].*

(Continued)

*Primary Examiner* — Oommen Jacob
(74) *Attorney, Agent, or Firm* — Fujitsu Patent Center

(57) ABSTRACT

An optical receiving device includes multiple input ports to which light is input; multiple amplifiers that are arrayed and provided corresponding to the input ports, respectively, each of the amplifiers amplifying and outputting light input from a corresponding input port among of the input ports; a photo diode that converts light into an electrical signal; and a lens that inputs to the photo diode light output from the amplifiers.

11 Claims, 5 Drawing Sheets

(56) References Cited

OTHER PUBLICATIONS

Extended European Search Report mailed by EPO and corresponding to Application No. 11194530.9 on May 22, 2012.

Cheng, Ning et al., "Large Splitting and Long Reach Passive Optical Networks with", ECOC IEEE, Sep. 19-23, 2010.
JPOA—Office Action of Japan Patent Application No. 2011-037688 dated Oct. 28, 2014, with English translation of the relavant part, p. 1, line 19 to p. 3, line 18 of the Office Action.

* cited by examiner

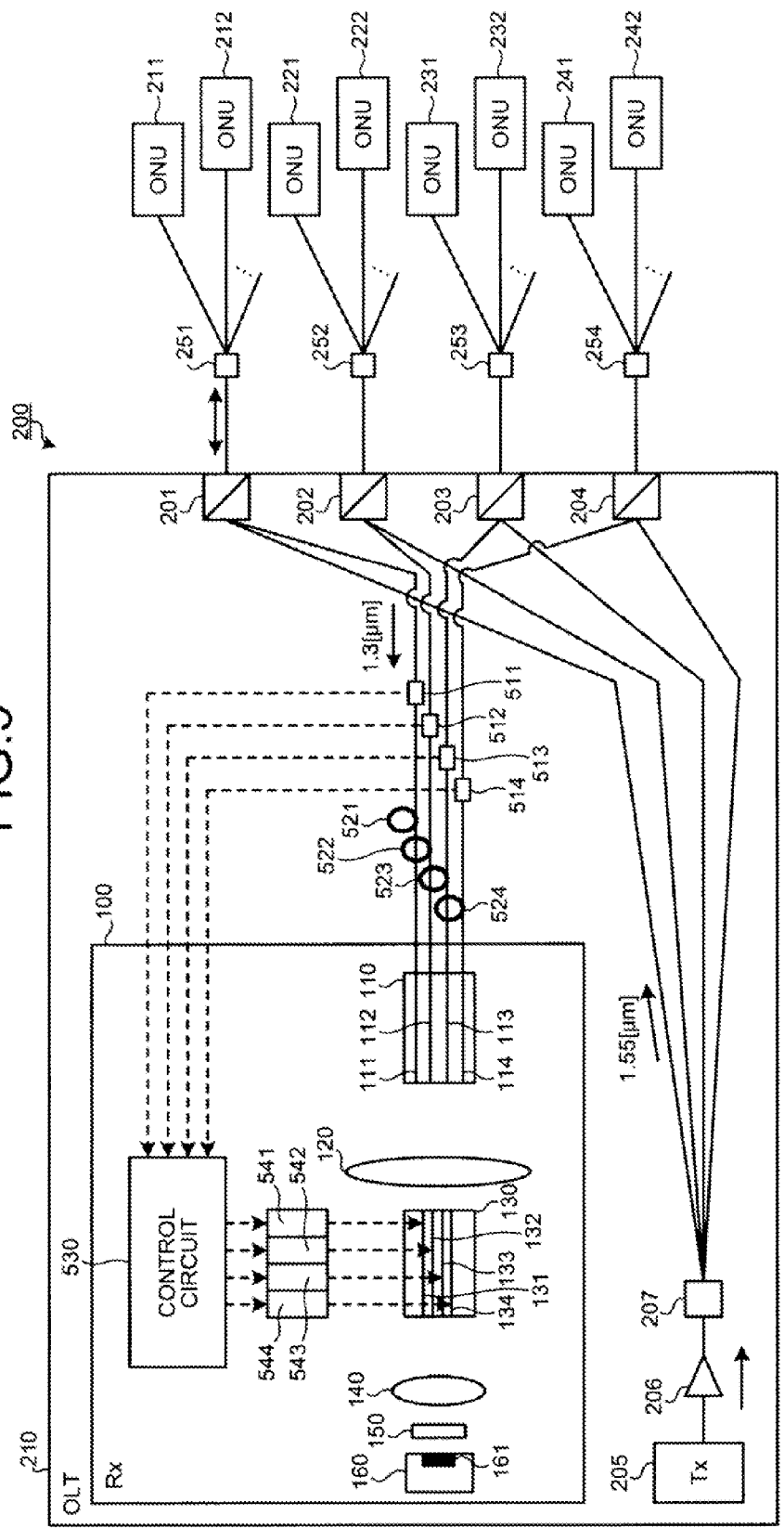

US 8,942,567 B2

OPTICAL RECEIVING DEVICE AND COMMUNICATION SYSTEM

CROSS REFERENCE TO RELATED APPLICATIONS

This application is based upon and claims the benefit of priority of the prior Japanese Patent Application No. 2011-037688, filed on Feb. 23, 2011, the entire contents of which are incorporated herein by reference.

FIELD

The embodiments discussed herein are related to an optical receiving device and a communication system.

BACKGROUND

Optical networks are used as high-capacity transmission networks. As one scheme of optical network, a passive optical network (PON) is known in which optical signals transmitted in bursts from multiple optical network units (ONUs) are combined by a star coupler and received by a single optical line terminal (OLT).

A PON to which time division multiplexing (TDM) is applied is known as TDM-PON in which downstream signals from the OLT to the ONUs are transmitted according to TDM and upstream signals from the ONUs to the OLT are transmitted according to time division multiple access (TDMA). Since the wavelength used in the upstream transmission system of TDM-PON is 1.3 μm band, the fiber loss is greater than transmission using 1.55 μm band and signals are likely to be deteriorated.

Further, in the upstream transmission system of TDM-PON, the optical power is significantly deteriorated due to splitting by the optical splitter (optical coupler). Thus, it is further difficult to increase the number of splits and/or to extend the transmission distance. Generally, an increase of the number of splits and an extension of the transmission distance have a trade-off relationship since the number of splits and the amount of loss/deterioration at the optical splitter have a substantially inverse relationship. An OLT is also known that causes light output from a fiber array to be received by a PD using a lens array and a condensing lens (see, for example, Cheng, Ning, et al, "Large Splitting and Long Reach Passive Optical Networks with Mode Coupling Receivers," ECOC, September 2010).

However, in the conventional technology described above, the optical loss of signals received by the OLT differs for each ONU if the distance to the OLT differs for each ONU. Thus, it is difficult to keep the power of light that is received at a photo diode of the OLT within a given dynamic range. Consequently, light from the ONUs cannot be accurately received.

To cope with this problem, an optical pre-amplifier may be provided in each ONU to independently amplify the light from the ONU at the ONU. However, this results in a larger and more expensive ONU. Further, at the OLT, it is difficult to control the gain of the optical amplifier provided in each ONU.

Alternatively, an optical post-amplifier may be provided in the OLT to amplify, at the OLT, the light transmitted according to TDMA from each ONU. However, since the optical loss of the signals received by the OLT differs for each ONU, the gain for compensating the loss differs for each ONU.

Thus, it is difficult to keep the power within a given dynamic range by the optical post-amplifier.

SUMMARY

According to an aspect of an embodiment, an optical receiving device includes multiple input ports to which light is input; multiple amplifiers that are arrayed and provided corresponding to the input ports, respectively, each of the amplifiers amplifying and outputting light input from a corresponding input port among of the input ports; a photo diode that converts light into an electrical signal; and an optical system that inputs to the photo diode light output from the amplifiers.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a diagram of an example of a configuration of a communication system according to a second embodiment.

DESCRIPTION OF EMBODIMENTS

Preferred embodiments of the present invention will be explained with reference to the accompanying drawings.

Figure 1:
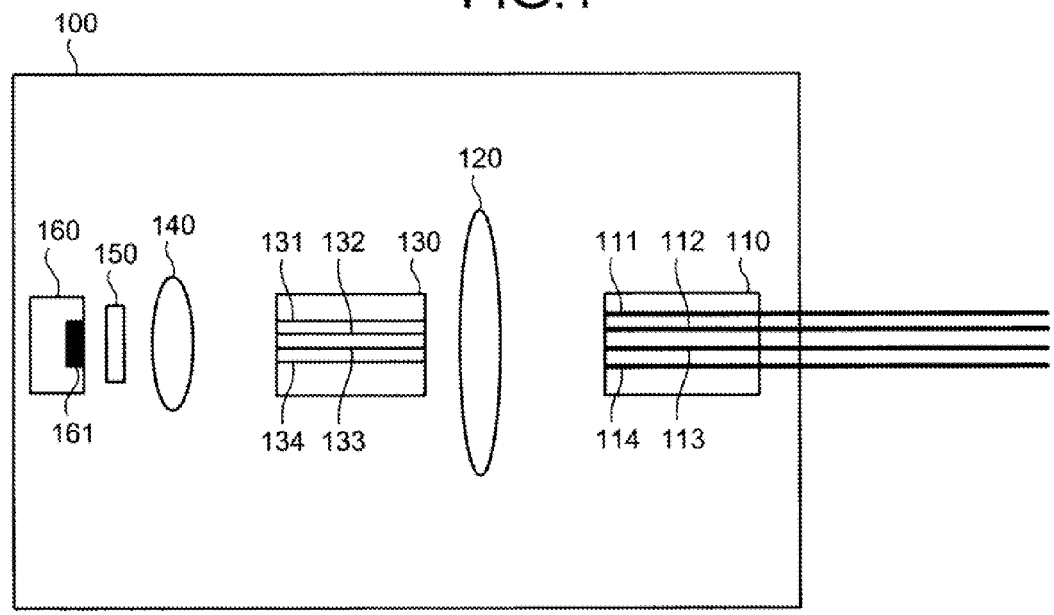
FIG. 1 is a diagram of an example of a configuration of an optical receiving device according to a first embodiment.

FIG. 1 is a diagram of an example of a configuration of an optical receiving device according to a first embodiment. As depicted in FIG. 1, an optical receiving device 100 according to the first embodiment includes a fiber array 110, a lens 120, an SOA array 130, a lens 140, a wavelength filter 150, and a PD 160. The optical receiving device 100 can be applied to, for example, an OLT used in a communication system of TDM-PON.

The fiber array 110 includes arrayed (i.e., one-dimensionally arranged) optical fibers 111 to 114. The optical fibers 111 to 114 are multiple input ports to which light is input from an external source outside the optical receiving device 100. When the optical receiving device 100 is applied to the OLT used in the communication system of TDM-PON, ONUs connected to the optical fibers 111 to 114 transmit optical signals according to TDMA. Thus, an optical signal is input from any one of the optical fibers 111 to 114 in each time slot. Each of the optical fibers 111 to 114 outputs the input light to the lens 120.

The lens 120 is an optical system that inputs light from the optical fibers 111 to 114 into the inputs of SOAs 131 to 134 of the SOA array 130, respectively. Here, the optical system that inputs the light into the SOA array 130 is configured by a single lens 120. Alternatively, the optical system may be configured by multiple lenses.

The SOA array 130 includes arrayed (i.e., one-dimensionally arranged) semiconductor optical amplifiers (SOAs) 131 to 134 corresponding to the optical fibers 111 to 114, respectively. The light output from the optical fibers 111 to 114 and transmitted through the lens 120 is input into the inputs of the SOAs 131 to 134, respectively.

Each of the SOAs 131 to 134 amplifies the input light and outputs the light to the lens 140. Each of the SOAs 131 to 134 is a variable amplifier that amplifies light by a variable gain according to an external driving signal, and can be configured by, for example, a single-mode optical waveguide.

The lens 140 is an optical system that inputs light from the SOAs 131 to 134 into a single PD 160. For example, the lens 140 is adjusted such that the light assumed to be output from the SOAs 131 to 134 at the same time converges on the PD 160. Here, the optical system that inputs the light into the PD 160 is configured by a single lens 140. Alternatively, the optical system may be configured by multiple lenses.

The wavelength filter 150 is provided between the SOA array 130 and the PD 160, and transmits light output from the SOA array 130 to the PD 160. In the example of FIG. 1, the wavelength filter 150 is provided between the lens 140 and the PD 160. The wavelength filter 150 attenuates the amplified spontaneous emission (ASE) light generated in the SOAs 131 to 134 by attenuating a given wavelength band of the transmitted light. However, the wavelength filter 150 may be omitted if the impact of the ASE light does not need to be considered.

The PD 160 includes a light receiving unit 161 that converts light input by the lens 140 into an electrical signal. The PD 160 outputs the electrical signal converted by the light receiving unit 161. The electrical signal output from the PD 160 is processed by, for example, an internal or external signal processing circuit of the optical receiving device 100.

Thus, the light output from the SOAs 131 to 134 can be input into the PD 106 directly by the lens 140 without coupling the outputs of the SOAs 131 to 134 and the PD 160 by an optical fiber and an optical coupler, thereby reducing the number of couplings by the optical coupler provided on a path from each ONU to the PD 160, and reducing the coupling loss due to the optical coupler.

For example, compared to a case where the light output from the SOAs 131 to 134 are coupled by an optical fiber and an optical coupler, and input into the PD 160, it becomes possible to use, as power budget, the coupling loss due to the optical coupler (about 6.5 dB for 4 splits) and the coupling loss between each of the outputs of the SOAs 131 to 134 and the optical fiber (for example, about 1.5 dB).

Further, the gain of the light along each of the optical fibers 111 to 114 can be independently adjusted since the light input from the optical fibers 111 to 114 are amplified by amplifiers (the SOAs 131 to 134). Thus, it becomes possible to keep the power of light received at the PD 160 within the dynamic range of the PD 160 even when the power of the input light varies among the optical fibers 111 to 114, thereby expanding the power budget.

In the example of FIG. 1, the fiber array 110 includes 4 optical fibers 111 to 114. However, the fiber array 110 may include n optical fibers, where n is a natural number greater than 1. In this case, the SOA array 130 also includes n SOAs.

Figure 2:
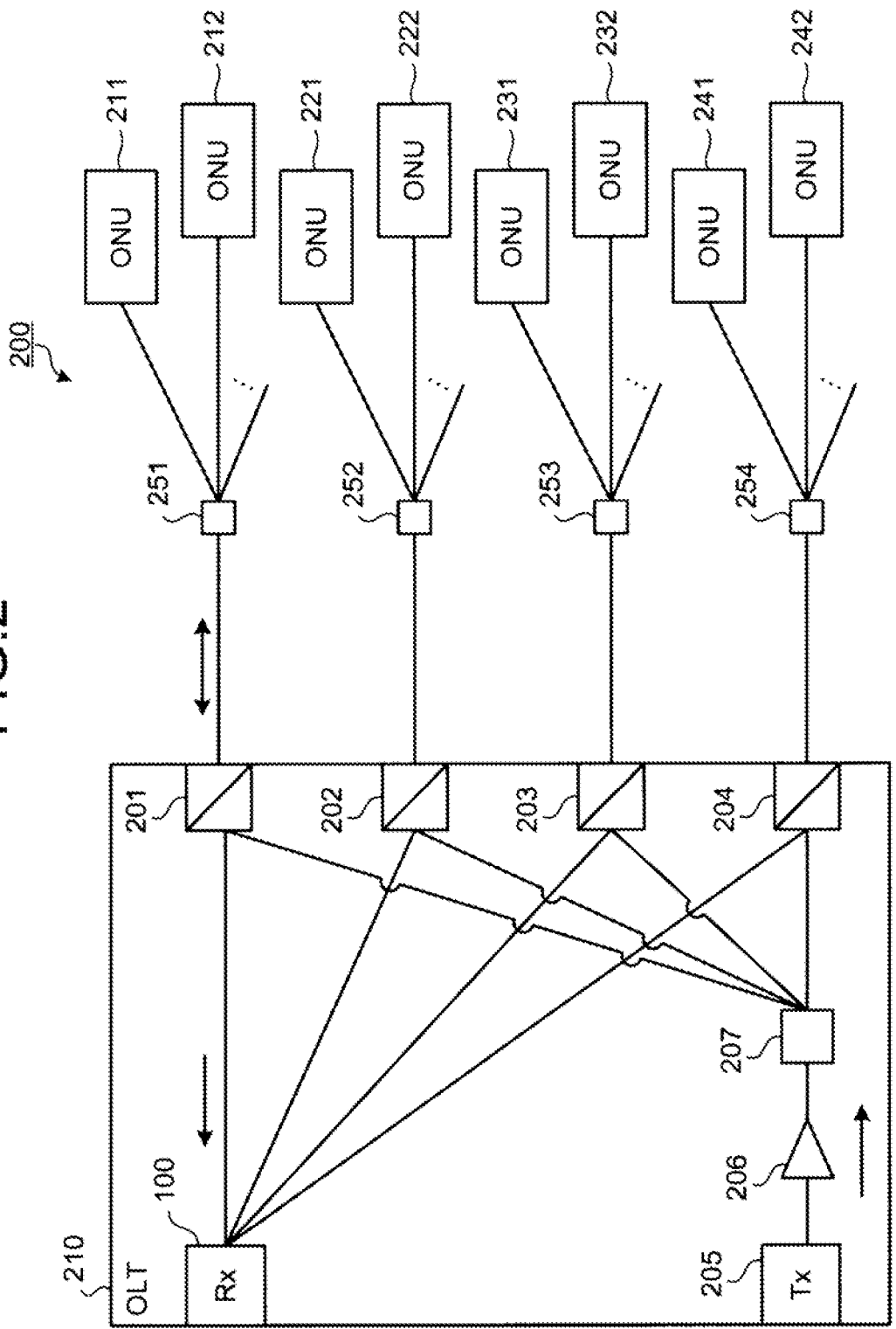
FIG. 2 is a diagram of a first example of a configuration of a communication system to which the optical receiving device depicted in FIG. 1 is applied.

FIG. 2 is a diagram of a first example of a configuration of a communication system to which the optical receiving device depicted in FIG. 1 is applied. A communication system 200 depicted in FIG. 2 is a communication system of TDM-PON, and includes an OLT 210, ONUs 211, 212, . . . , ONUs 221, 222, . . . , ONUs 231, 232, . . . , ONUs 241, 242, . . . , and optical couplers 251 to 254.

In the following description, the ONUs 211, 212, . . . , the ONUs 221, 222, . . . , the ONUs 231, 232, . . . , and the ONUs 241, 242, . . . connected to the OLT 210 are simply called "ONUs." The ONUs are classified into groups, the number of which is smaller than the number of the ONUs (4 in the example of FIG. 2), and connected to the OLT 210 by the optical couplers 251 to 254 corresponding to the groups, respectively.

For example, the ONU are classified into groups according to the optical loss caused on paths to the OLT 210 (for example, the optical fibers 111 to 114 of the optical receiving device 100), and are bundled by the optical couplers 251 to 254 for the respective groups. For example, since the optical loss caused on a path depends on the length of the path, such classification can be achieved by classifying the ONUs according to the length of the paths to the OLT. As a result of this classification, ONUs having nearly the same optical loss caused on the paths to the OLT 210 are respectively connected to the optical couplers 251 to 254.

The ONUs 211, 212, . . . are connected to the OLT 210 via the optical coupler 251, and are optical transmitting devices that transmit upstream optical signals destined for the OLT 210 to the optical coupler 251 according to TDMA. The ONUs 211, 212, . . . also receive a signal addressed thereto and included in the downstream optical signal transmitted according to TDM from the OLT 210, via the optical coupler 251. Similarly, the ONUs 221, 222, . . . , the ONUs 231, 232, . . . , and the ONUs 241, 242, . . . are connected to the OLT 210 via the optical couplers 252 to 254, respectively, and transmit/receive optical signals to/from the OLT 210.

The optical coupler 251 outputs the optical signals transmitted according to TDMA from the ONUs 211, 212, . . . to the OLT 210. Similarly, the optical couplers 252 to 254 output the optical signals transmitted according to TDMA from the ONUs 221, 222, . . . , the ONUs 231, 232, . . . , and the ONUs 241, 242, . . . to the OLT 210, respectively.

The optical coupler 251 also splits an optical signal output from the OLT 210, and outputs the resulting optical signals to the ONUs 211, 212, . . . . Similarly, the optical couplers 252 to 254 split optical signals output from the OLT 210, and output the resulting optical signals to the ONUs 221, 222, . . . , the ONUs 231, 232, . . . and the ONUs 241, 242, . . . .

As described above, in the communication system 200, the ONUs (the ONUs 211, 212, . . . , the ONUs 221, 222, . . . , the ONUs 231, 232, . . . and the ONUs 241, 242, . . . ) are bundled by multiple optical couplers (the optical couplers 251 to 254), the number of which is smaller than the number of the ONUs.

The OLT 210 includes the optical receiving device 100 (Rx), splitter wavelength filters 201 to 204, an optical transmitting device 205 (Tx), an optical amplifier 206, and an optical coupler 207. The optical receiving device 100 is the same as that depicted in FIG. 1.

The splitter wavelength filters 201 to 204 are connected to the optical couplers 251 to 254, respectively, and transmit only a given wavelength component (for example, 1.3 μm) included in light output from the optical couplers 251 to 254 to the optical receiving device 100, thereby outputting upstream optical signals from the ONUs to the optical receiving device 100.

The splitter wavelength filters 201 to 204 also transmit only a given wavelength component (for example, 1.55 μm) included in light output from the optical coupler 207 to the optical couplers 251 to 254, thereby outputting a downstream optical signal from the optical transmitting device 205 to the optical couplers 251 to 254.

The light respectively output from the splitter wavelength filters 201 to 204 is input into the optical fibers 111 to 114 of the optical receiving device 100, respectively. As described above, the optical receiving device 100 can separately adjust the gain of the light input from the optical fibers 111 to 114. Each of the optical couplers 251 to 254 is connected to ONUs having nearly the same optical loss.

Thus, an appropriate gain according to the optical loss can be set for the light from each of the ONUs by independently adjusting the gain of the light input into the optical receiving device 100. Thus, it becomes possible to keep the power of the light received from the ONUs at the PD 160, within the dynamic range of the PD 160.

The optical transmitting device 205 transmits the downstream optical signal destined for the ONUs according to TDM, to the optical amplifier 206 that amplifies the optical signal transmitted from the optical transmitting device 205 and outputs the amplified optical signal to the optical coupler 207. The optical coupler 207 splits the optical signal output from the optical amplifier 206, and outputs the resulting optical signals to the splitter wavelength filters 201 to 204, respectively.

Figure 3:
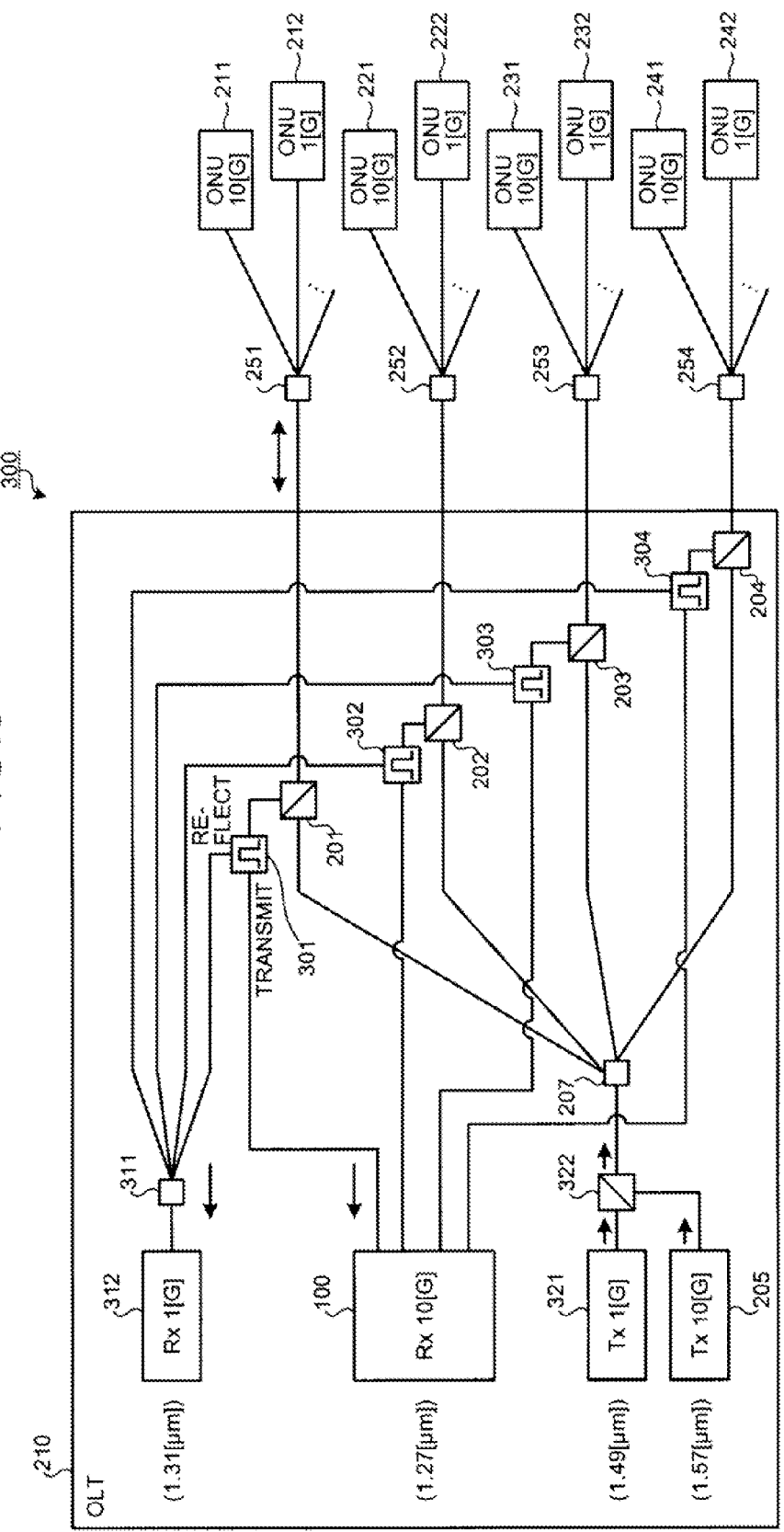
FIG. 3 is a diagram of a second example of a configuration of the communication system to which the optical receiving device depicted in FIG. 1 is applied.

FIG. 3 is a diagram of a second example of a configuration of the communication system to which the optical receiving device depicted in FIG. 1 is applied. In FIG. 3, components similar to those depicted in FIG. 2 are assigned the same reference numeral used in FIG. 2 and description is omitted. A communication system 300 depicted in FIG. 3 is a communication system of TDM-PON, having signals of different transmission rates and wavelengths, i.e., the optical signals transmitted in the communication system 300 include optical signals having different transmission rates.

For example, upstream optical signals of the communication system 300 include an optical signal having a transmission rate of 1 G and a wavelength of 1.31 µm, and an optical signal having a transmission rate of 10 G and a wavelength of 1.27 µm. A downstream optical signal of the communication system 300 includes an optical signal having a transmission rate of 1 G and a wavelength of 1.49 µm, and an optical signal having a transmission rate of 10 G and a wavelength of 1.57 µm.

Each of the ONUS 211, 221, 231, and 241 (ONU 10[G]) is an ONU having a transmission rate of 10 G. For example, each of the ONUS 211, 221, 231, and 241 transmits an optical signal having a transmission rate of 10 G and a wavelength of 1.27 µm, and receives an optical signal having a transmission rate of 10 G and a wavelength of 1.57 µm.

Each of the ONUS 212, 222, 232, and 242 (ONU 1[G]) is an ONU having a transmission rate of 1 G. For example, each of the ONUS 212, 222, 232, and 242 transmits an optical signal having a transmission rate of 1 G and a wavelength of 1.31 µm, and receives an optical signal having a transmission rate of 1 G and a wavelength of 1.49 µm.

The OLT 210 includes the splitter wavelength filters 201 to 204, transmission band-pass filters 301 to 304, an optical coupler 311, the optical receiving device 100 (Rx 10[G]), an optical receiving device 312 (Rx 1[G]), the optical transmitting device 205 (Tx 10[G]), an optical transmitting device 321 (Tx 1[G]), and a coupling wavelength filter 322.

The splitter wavelength filters 201 to 204 are connected to the optical couplers 251 to 254, respectively, and transmit only a given wavelength component (for example, 1.31 µm and 1.27 µm) included in light output from the optical couplers 251 to 254 to the transmission band-pass filters 301 to 304, respectively.

The splitter wavelength filters 201 to 204 also transmit only a given wavelength component (for example, 1.57 µm and 1.49 µm) included in light output from the optical coupler 207 to the optical couplers 251 to 254, thereby outputting a downstream optical signal from the optical transmitting device 205 to the optical couplers 251 to 254.

The transmission band-pass filters 301 to 304 transmit only a given wavelength component (for example, 1.27 µm) included in light output from the splitter wavelength filters 201 to 204 to the optical receiving device 100, thereby outputting optical signals having a transmission rate of 10 G from the ONUs 211, 221, 231, and 241 to the optical receiving device 100.

The transmission band-pass filters 301 to 304 also transmit only a given component (for example, 1.31 µm) included in light output from the splitter wavelength filters 201 to 204 to the optical coupler 311, thereby outputting optical signals having a transmission rate of 1 G from the ONUs 212, 222, 232, and 242 to the optical coupler 311.

The optical receiving device 100 receives the optical signals output from the transmission band-pass filters 301 to 304. The optical coupler 311 outputs the optical signals having a transmission rate of 1 G output from the transmission band-pass filters 301 to 304 to the optical receiving device 312 that receives the optical signals output from the optical coupler 311.

The optical transmitting device 205 outputs an optical signal of 10 G destined for the ONUs 211, 221, 231, and 241 (and having a wavelength of 1.57 µm), to the coupling wavelength filter 322. The optical transmitting device 321 outputs an optical signal of 1 G destined for the ONUs 212, 222, 232, and 242 (and having a wavelength of 1.49 µm), to the coupling wavelength filter 322.

The coupling wavelength filter 322 couples the optical signal (having a wavelength of 1.57 µm) output from the optical transmitting device 205 and the optical signal (having a wavelength of 1.49 µm) output from the optical transmitting device 321, and outputs the coupled optical signal to the optical coupler 207 that splits the coupled optical signal output from the coupling wavelength filter 322.

Another optical receiving device 100 may be further provided in place of the optical receiving device 312 and the optical coupler 311. In this case, the light output from the transmission band-pass filters 301 to 304 is input into the optical fibers 111 to 114 of the optical receiving device 100 provided in place of the optical receiving device 312 and the optical coupler 311.

Figure 4:
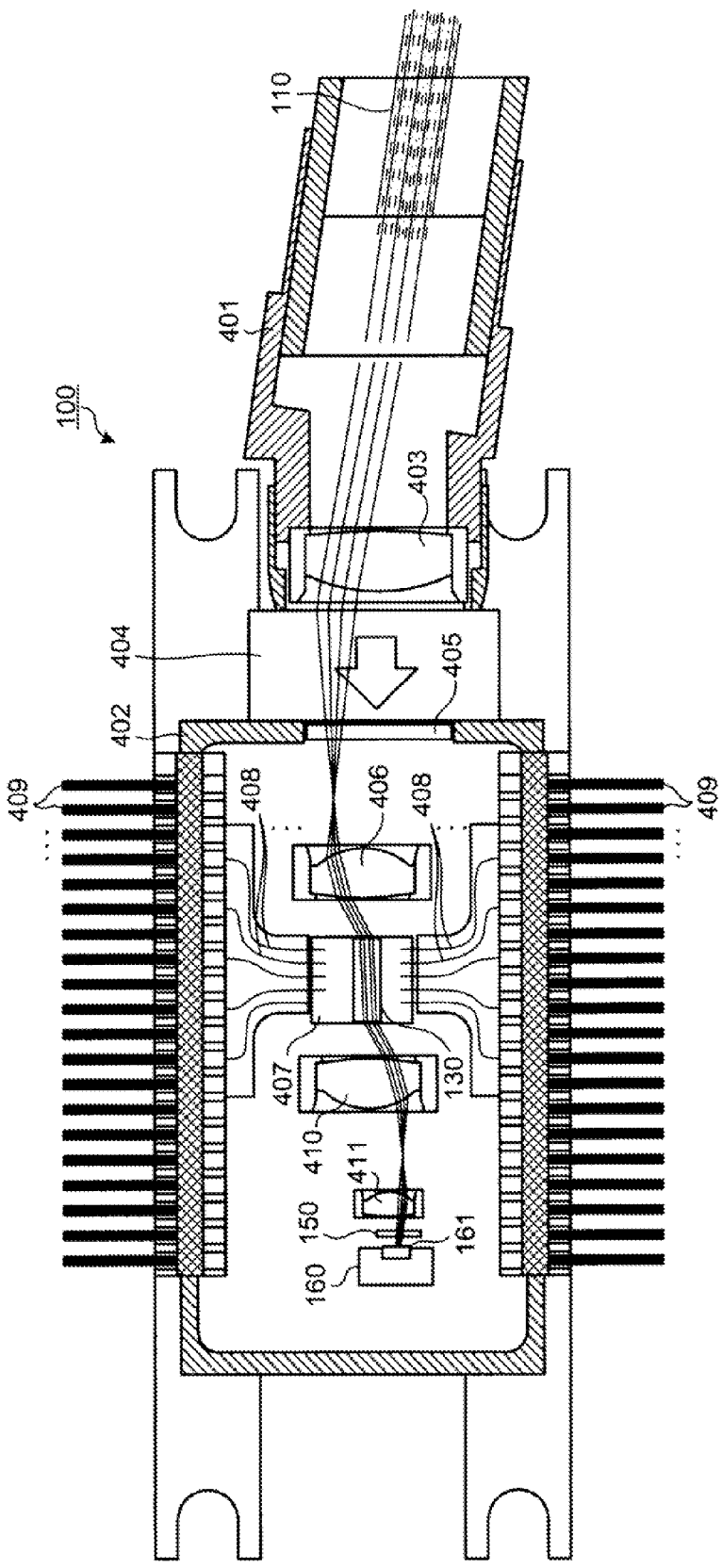
FIG. 4 is a diagram of an example of a specific configuration of the optical receiving device depicted in FIG. 1.

FIG. 4 is a diagram of an example of a specific configuration of the optical receiving device depicted in FIG. 1. In FIG. 4, components similar to those depicted in FIG. 1 are assigned the same reference numerals used in FIG. 1 and description is omitted. The optical receiving device 100 depicted in FIG. 4 includes the fiber array 110, a connector 401, a housing 402, a lens 403, an isolator 404, a window 405, a lens 406, the SOA array 130, a carrier 407, wirings 408, terminals 409, a lens 410, a lens 411, the wavelength filter 150, and the PD 160.

The fiber array 110 is connected to the housing 402 by the connector 401. The light output from the fiber array 110 is input into the housing 402 via the lens 403, the isolator 404, and the window 405. The housing 402 houses the lens 403, the isolator 404, the window 405, the lens 406, the SOA array 130, the carrier 407, the wirings 408, the terminals 409, the lens 410, the lens 411, and the PD 160. The light input into the housing 402 is input into the inputs of the SOAs 131 to 134 of the SOA array 130 by the lens 406.

The SOA array 130 is fixed on the carrier 407 that is a heat dissipater, for example, and is fixed in the housing 402. The temperature of the carrier 407 may be controlled by a peltier element (not depicted), thereby controlling the temperature of the SOA array 130. The light output from the SOAs 131 to 134 of the SOA array 130 is input into the light receiving unit 161 of the PD 160 by the lenses 410 and 411, which correspond to the lens 140 depicted in FIG. 1.

The light output from the SOAs 131 to 134 is input into the lenses 410 and 411 at an angle. The lenses 410 and 411 transmit the light output from the SOAs 131 to 134 at a position other than the center, thereby adjusting the focal points of the light output from the SOAs 131 to 134 at an angle, to the PD 160 due to the aberration of the lenses 410 and 411.

The SOAs 131 to 134 of the SOA array 130 are connected to the terminals 409 via the wirings 408. The terminals 409 are lead to the outside of the housing 402. The terminals 409 includes, for example, input terminals for driving signals of the SOAs 131 to 134 of the SOA array 130, input terminals for driving signals of the peltier element (not depicted), and an output terminal of the electrical signal output from the PD 160. For example, ON/OFF and the gain of the amplification by the SOAs 131 to 134 can be controlled by controlling a driving signal input from the terminals 409. The electrical signal output from the PD 160 is output to, for example, an external signal processing circuit via the terminals 409.

As described above, according to the first embodiment, light from multiple paths input by the optical fibers 111 to 114 are independently amplified by the SOA array 130, thereby amplifying the light appropriately according to optical loss, and keeping the power of light received at the PD 160, within the dynamic range of the PD 160. Thus, even when the optical loss of the light input from the paths connected to the optical receiving device 100 varies among the paths due to differences in the length of the paths, the light can be accurately received and transmission performance can be improved.

Further, compared to a case where the outputs of the SOA array 130 and the PD 160 are coupled by an optical fiber and an optical coupler, the optical loss can be reduced by inputting the light output from the SOA array 130 to the photo diode by the optical system. Thus, the light can be accurately received and transmission performance can be improved. Consequently, it becomes possible to increase the number of ONUs connected to the OLT 210 and/or to extend the transmission distance between the OLT 210 and the ONUs.

FIG. 5 is a diagram of an example of a configuration of a communication system according to a second embodiment. In FIG. 5, components similar to those depicted in FIG. 1 or FIG. 2 are assigned the same reference numerals used in FIGS. 1 and 2, and description is omitted. As depicted in FIG. 5, the OLT 210 according to the second embodiment includes tap PDs 511 to 514 and delay units 521 to 524 in addition to the components depicted in FIG. 2.

The tap PDs 511 to 514 split a component of the optical signals output from the splitter wavelength filters 201 to 204 to the optical receiving device 100, respectively, convert the split optical signals into electrical signals, and output the converted electrical signals to the optical receiving device 100. The delay units 521 to 524 delay the optical signals output from the splitter wavelength filters 201 to 204 to the optical receiving device 100 by a given time, respectively.

The optical receiving device 100 includes a control circuit 530 and driving units 541 to 544 in addition to the components depicted in FIG. 1. The control circuit 530 is an obtaining unit that obtains electrical signals output from the tap PDs 511 to 514 as input information indicating whether light is input into the SOAs 131 to 134. Since the electrical signals output from the tap PDs 511 to 514 indicate whether light is input from the optical fibers 111 to 114, the electrical signals can be considered as the input information indicating whether light is input into the SOAs 131 to 134.

The control circuit 530 is a control unit that controls the SOAs 131 to 134, based on the obtained input information. For example, the control circuit 530 controls the driving units 541 to 544 such that the gain of any of the SOAs 131 to 134 to which no light is input becomes smaller than the gain of other SOAs to which light is input, thereby reducing the ASE light generated in the SOA(s) to which no light is input, and reducing the noise of the optical signal received by the PD 160.

For example, the control circuit 530 makes the gain of the SOA(s) to which no light is input to be 0 by not inputting a driving current, thereby preventing the generation of ASE light in the SOA(s) to which no light is input, and reducing the noise of the optical signal received by the PD 160. The driving units 541 to 544 input driving currents to the SOAs 131 to 134 under the control of the control circuit 530, respectively. The SOAs 131 to 134 amplify light according to the driving currents input from the driving units 541 to 544, respectively.

For example, in a time slot where one of the ONUs 211, 212, . . . transmits an optical signal to the OLT 210, other ONUs do not transmit optical signals. Consequently, an optical signal is input to the optical fiber 111 while no optical signal is input to the optical fibers 112 to 114. The optical signal is input into the SOA 131 while no optical signal is input to the SOAs 132 to 134.

An electrical signal is input into the control circuit 530 from the tap PD 511 while no electrical signal is input into the control circuit 530 from the tap PDs 512 to 514. Thus, the control circuit 530 can recognize that an optical signal is input into the SOA 131 while no optical signal is input into the SOAs 132 to 134, and inputs a driving current into the SOA 131 while inputting no driving current into the SOAs 132 to 134. Thus, the optical signal is amplified by the SOA 131 while preventing the generation of ASE light in the SOAs 132 to 134 to which no optical signal is input.

As described above, according to the second embodiment, the gain of an SOA to which no light is input can be made lower than the gain of other SOAs to which light is input (for example, the gain can be made to be 0), thereby reducing the ASE light generated in the SOA(s) to which no light is input. Thus, the light can be accurately received by the PD 160 and transmission performance can be improved.

Further, fast control of the gain can be achieved by amplifying the light input from the optical fibers 111 to 114 by the SOAs 131 to 134. Thus, even if the SOAs to which light is input are switched consequent to TDMA, the gain of the SOAs 131 to 134 can be controlled accordingly.

As described above, according to the optical receiving device and the communication system, transmission performance can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An optical receiving device comprising:
a plurality of input ports to which light is input;
a plurality of amplifiers that are arrayed and provided corresponding to the input ports, respectively, each of the amplifiers amplifying and outputting light input from a corresponding input port among of the input ports;

a photo diode that converts light into an electrical signal a lens that inputs to the photo diode, light output from the amplifiers; and a control circuit that obtains input information indicating whether light is input into the amplifiers, based on the obtained input information, controls gain of an amplifier among the amplifiers and to which no light is input, to be lower than gain of an amplifier among the amplifiers and to which light is input.

2. The optical receiving device according to claim 1, wherein each of the amplifiers is a semiconductor optical amplifier.

3. The optical receiving device according to claim 1, wherein a plurality of optical transmitting devices that transmit light are classified into a plurality of groups, a plurality of optical couplers are provided corresponding to the groups, respectively, each of the optical couplers outputting light transmitted from an optical transmitting device included in a corresponding group among the groups, and light output from the optical couplers is input into the input ports, respectively.

4. The optical receiving device according to claim 3, wherein the optical transmitting devices are classified into the groups according to optical loss caused on paths to the input ports.

5. The optical receiving device according to claim 1, wherein light transmitted according to time division multiple access from the optical transmitting devices connected to the input ports is input into the input ports.

6. The optical receiving device according claim 1, further comprising a filter that attenuates amplified spontaneous emission generated by the amplifiers and is provided between the amplifiers and the photo diode.

7. A communication system comprising:

a plurality of optical transmitting devices classified into a plurality of groups;

a plurality of optical couplers that are provided corresponding to the groups, respectively, each of the optical couplers outputting light transmitted from an optical transmitting device included in a corresponding group among the groups; and an optical receiving device that receives light output from the optical couplers, wherein the optical receiving device includes:

a plurality of input ports to which light output from the optical couplers is input;

a plurality of amplifiers that are arrayed and provided corresponding to the input ports, respectively, each of the amplifiers amplifying and outputting light input from a corresponding input port among the input ports;

a photo diode that converts light into an electrical signal a lens that inputs to the photo diode, light output from the amplifiers; and a control circuit that obtains input information indicating whether light is input into the amplifiers, based on the obtained input information, controls gain of an amplifier among the amplifiers and to which no light is input, to be lower than gain of an amplifier among the amplifiers and to which light is input.

8. The communication system according to claim 7, wherein each of the amplifiers is a semiconductor optical amplifier.

9. The communication system according to claim 7, wherein the optical transmitting devices are classified into the groups according to optical loss caused on paths to the optical receiving device.

10. The communication system according to claim 7, wherein the optical transmitting devices transmit light according to time division multiple access.

11. The communication system according to claim 7, wherein the optical receiving device further includes a filter that attenuates amplified spontaneous emission generated by the amplifiers between the amplifiers and the photo diode.

* * * * *